United States Patent
Bertin et al.

(10) Patent No.: US 6,496,037 B1
(45) Date of Patent: Dec. 17, 2002

(54) AUTOMATIC OFF-CHIP DRIVER ADJUSTMENT BASED ON LOAD CHARACTERISTICS

(75) Inventors: Claude L. Bertin, South Burlington, VT (US); John A. Fifield, Underhill, VT (US); Thomas M. Maffitt, Burlington, VT (US); Wilbur D. Pricer, Charlotte, VT (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/588,202

(22) Filed: Jun. 6, 2000

(51) Int. Cl.[7] ................ H03K 19/0175; H03K 17/16
(52) U.S. Cl. .......................................... 326/82; 326/30
(58) Field of Search ................. 326/82–83, 86–87, 326/30, 26–27

(56) References Cited

U.S. PATENT DOCUMENTS

| | | | | |
|---|---|---|---|---|
| 5,134,311 A | * | 7/1992 | Biber et al. | ........... 327/108 |
| 5,327,317 A | * | 7/1994 | Lee | |
| 5,337,254 A | * | 8/1994 | Knee et al. | |
| 5,677,639 A | * | 10/1997 | Masiewicz | ............ 326/82 |
| 5,732,027 A | * | 3/1998 | Arcoleo et al. | |
| 5,838,177 A | * | 11/1998 | Keeth | |
| 5,864,506 A | * | 1/1999 | Arcoleo et al. | |
| 5,949,254 A | * | 9/1999 | Keeth | |
| 6,177,809 B1 | * | 1/2001 | Tonti et al. | ............ 326/83 |

* cited by examiner

*Primary Examiner*—Michael Tokar
*Assistant Examiner*—James A Cho
(74) *Attorney, Agent, or Firm*—Schmeiser, Olsen & Watts

(57) ABSTRACT

An automatic driver adjuster and methods using the same are provided that modify off-chip drivers based on load characteristics. The preferred embodiments are preferably automatic and require little or no human intervention. Preferred embodiments of the current invention analyze and determine the impedance of a node and adjust a number of output drivers in response to the impedance of the node, or analyze a resultant waveform of the node, caused by an input waveform, and adjust a number of output drivers in response to the resultant waveform of the node.

18 Claims, 12 Drawing Sheets

US 6,496,037 B1

AUTOMATIC OFF-CHIP DRIVER ADJUSTMENT BASED ON LOAD CHARACTERISTICS

BACKGROUND OF THE INVENTION

1. Technical Field

This invention relates to the field of drivers for semiconductor chips. More specifically, the invention relates to automatic off-chip driver adjustment based on load characteristics.

2. Background Art

An off-chip driver is the very last circuit before a signal leaves a chip and this driver drives data onto a board, wire, to another chip, etc. If the driver is a very strong driver, it has low impedance and high current. If such a driver is hooked up to a light load (in terms of capacitance, for instance), the driver over-drives the load and there will be instability, which causes ringing and excessive noise. On the other hand, if the driver is not strong enough, the driver will under-drive the load, and the performance suffers. The best driver design matches the driver's impedance to the load's impedance, ideally at the point where response of the system is at critical damping. At this point, the off-chip driver has the most performance with no ringing or other detrimental effects. System designers actually tend to use a little under damping, as this allows for variance in load impedance.

There has been some movement in recent years towards programmable off-chip drivers. For instance, drivers exist that can be set to a specific impedance by electrical adjustment (such as by connecting wires to the driver or programming it). However, this technique requires human intervention.

What is needed is an automatic off-chip driver that requires little or no human intervention and that adjusts itself, based on load characteristics, to the optimum driver strength and impedance.

DISCLOSURE OF INVENTION

To overcome these problems, the current invention provides an automatic driver adjuster and methods using the same that modify off-chip drivers based on load characteristics. The preferred embodiments are preferably automatic and require little or no human intervention. Preferred embodiments of the current invention analyze and determine the impedance of a node and adjust a number of output drivers in response to the impedance of the node, or analyze a resultant waveform of the node, caused by an input waveform, and adjust a number of output drivers in response to the resultant waveform of the node.

In this manner, the proper number and strength of drivers may be automatically chosen for the current load characteristics of impedance or signal waveforms. Should the load characteristics change, the mechanisms of the current invention may be used to ensure that the driver has the optimal drive strength to meet these changing load characteristics.

The foregoing and other features and advantages of the present invention will be apparent from the following more particular description of preferred embodiments of the invention, as illustrated in the accompanying drawings.

BRIEF DESCRIPTION OF DRAWINGS

Preferred embodiments of the present invention will hereinafter be described in conjunction with the appended drawings, where like designations denote like elements.

BEST MODE(S) FOR CARRYING OUT THE INVENTION

For those who are not familiar with the problems caused by off-chip driver matching, the following overview section gives a more detailed discussion of the problems associated with off-chip driver matching. Those skilled in that art of driver design may skip this section and proceed to the "Detailed Description" section.

Overview

Figure 12:
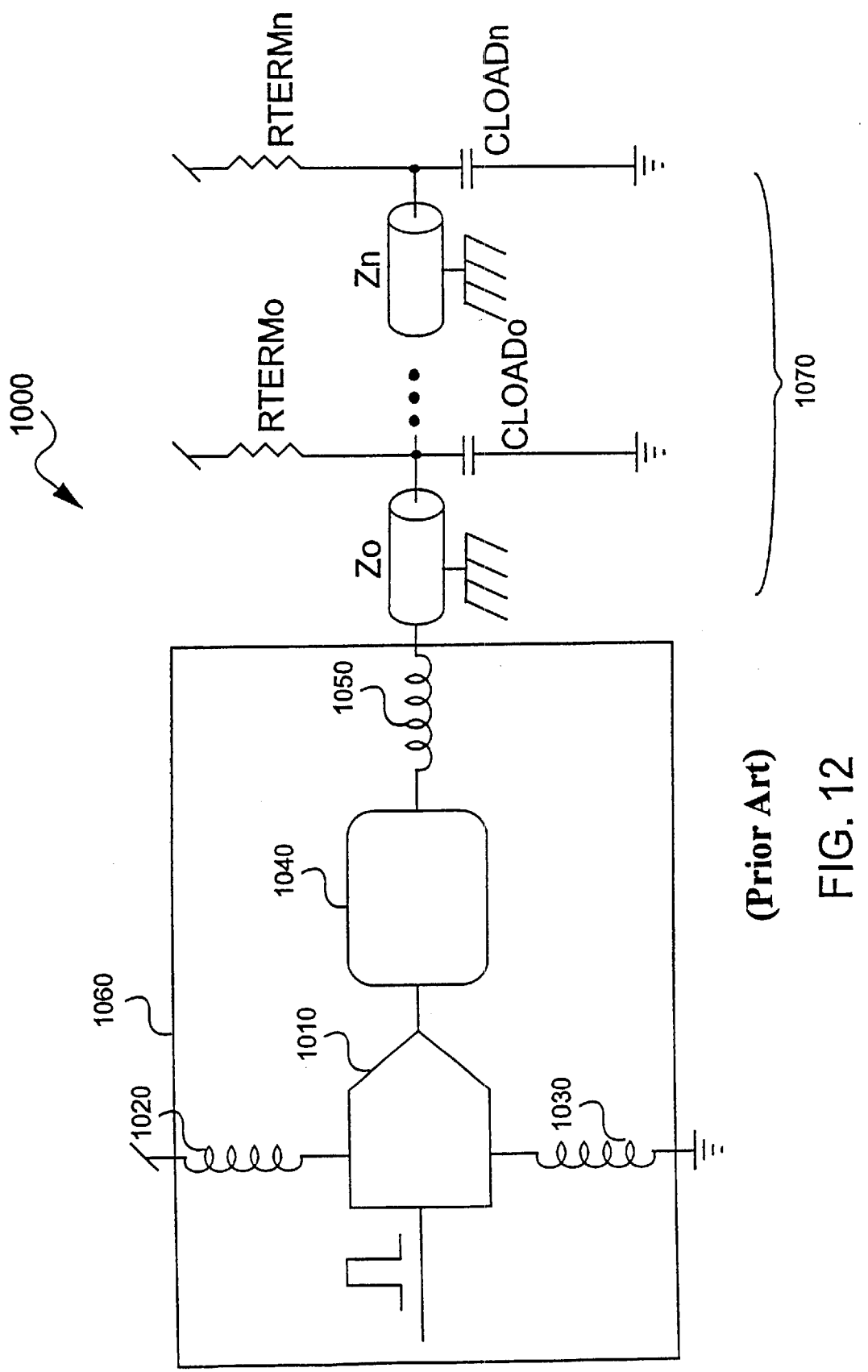
FIG. 12 is an overview of an off-chip driver, its location within a chip, and an exemplary complex load.

Turning now to FIG. 12, a system 1000 is shown that comprises chip portion 1060 and off-chip portion 1070. Chip portion 1060 is an illustration of one off-chip driver 1010 and one output pad 1040. Generally, on semiconductor chips, there would be many such drivers. Off-chip driver 1010 is connected to power through an off-chip pad (not shown) and a lead. This lead has some inductance, shown as inductance 1020. Off-chip driver 1010 is further connected to ground through an off-chip pad (not shown) and a lead. This lead has an inductance 1030. The off-chip driver 1010 drives the external load 1070 through output lead inductor 1050.

Off-chip portion 1070 has several transmission line impedances $Z_0$ through $Z_n$. Each transmission line may or may not terminate in a termination resistor (shown as $R_{term0}$ through $R_{termn}$), and will also terminate in a load having a capacitance (shown as $C_{load0}$ through $C_{loadn}$). From the off-chip driver's perspective, the combination of inductance 1050, the various transmission line impedances, the various resistances, and the various capacitances create a complex total impedance.

Figure 13:
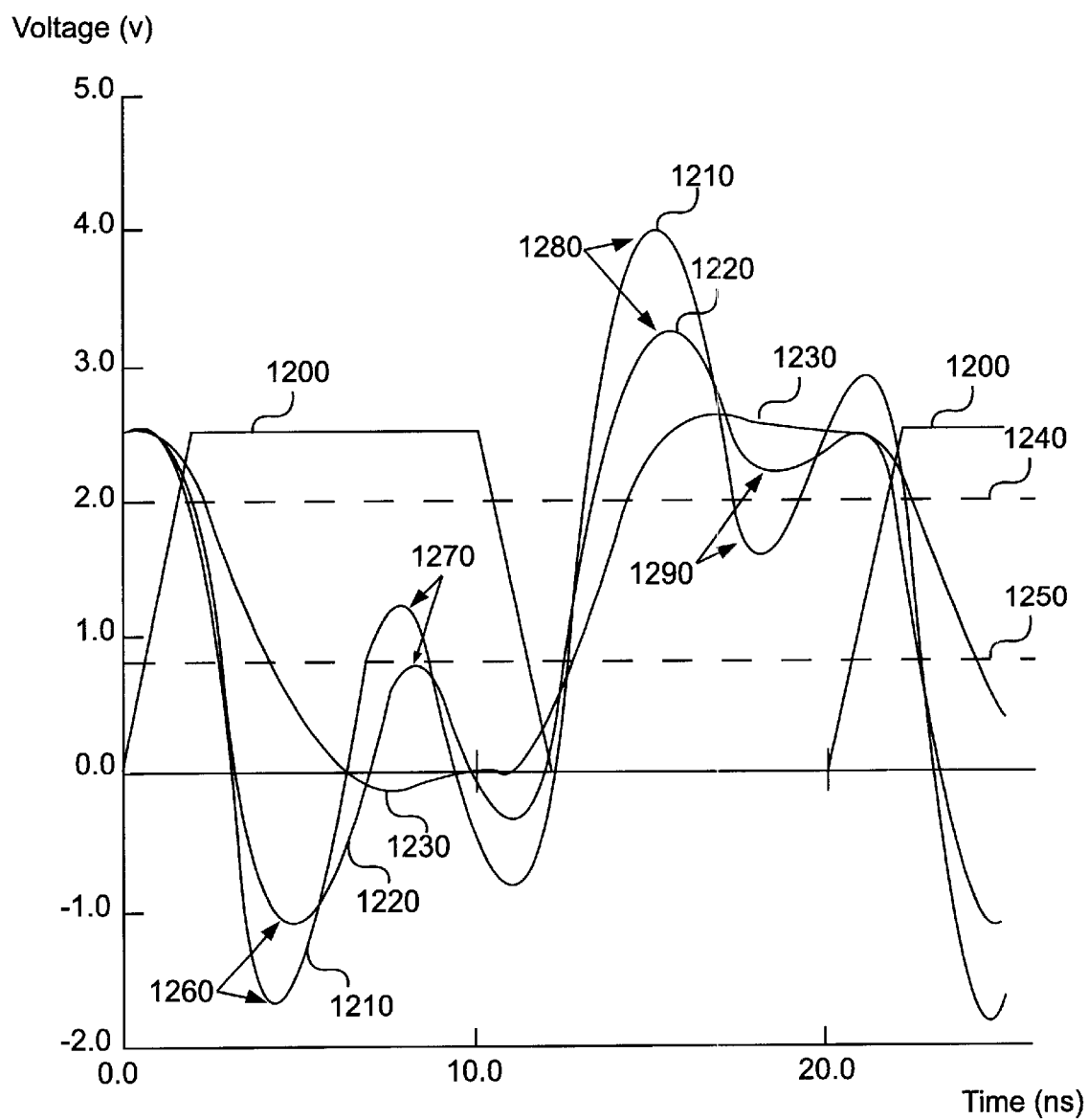
FIG. 13 is a graph of different resultant waveforms to an input waveform for a node having particular impedance and being driven by several different off-chip drivers with different source impedances.

The results of driving an output signal into the complex total impedance are shown in FIG. 13. This figure shows a graph of voltage (in volts) and time (in nanoseconds). This figure is a simulation of the response of an off-chip pad that is connected to a load of 50 picofarads and where the package (the lead inductance) has an inductance of 10 nanohenries. Curve 1200 is an exemplary cyclic input. High line 1240 indicates the voltage above which a "high" will be determined (generally referred to as $V_{OH}$), while low line 1250 indicates the voltage beneath which a "low" will be determined (generally referred to as $V_{OL}$).

Curves 1210, 1220, and 1230 are exemplary system responses, responding to input 1200, for different off-chip drivers having different source resistances (and therefore, different strengths). Peaks 1260 are the undershoot of these particular responses, and peaks 1280 are the overshoot of these responses. Peaks 1270 and 1290 are the "ring back" associated with these responses. Curve 1210 is the response of a system for a driver with a low source resistance. This response curve is very fast, as it transitions below low line 1250 within a few nanoseconds. However, it has a high amount of undershoot 1260, and it actually rings back 1270 above low line 1250 while input 1200 is still high. Moreover, when the input turns low, this response rises quickly to a high peak 1280 that is an overshoot, but then it rings back below high line 1240 due to its underdamped response. Hence, an overly strong driver produces fast output rise and fall times but produces data integrity problems from ring back.

Curve 1230, on the other hand, illustrates an off-chip driver with high source resistance, and therefore has very little overshoot, undershoot, and ring back. It is, however, very slow, and does not reach low line 1250 until several nanoseconds after curve 1210 has reached this level. For this particular load and package inductance, the rise of curve 1220 illustrates the best combination of speed and low undershoot and overshoot. Additionally, the ring back does not rise above line 1250 or fall below line 1240. This curve illustrates the system response for an off-chip driver having a medium level of source impedance. For this curve, the speed is very good, being only a fraction slower than curve 1210, yet the ring back is small enough to prevent errors.

Thus, FIG. 13 illustrates the designer's dilemma: if a designer designs an off-chip driver to be very fast, there is the chance that a small change in impedance will lead to instability and errors; if, however, a designer designs a slower off-chip driver, then the driver will have reduced performance.

DETAILED DESCRIPTION

To solve these problems, the current invention discloses an automatic driver adjuster and methods using the same that modify off-chip drivers based on load characteristics. The preferred embodiments are preferably automatic and require little or no human intervention. Preferred embodiments of the current invention analyze and determine the impedance of a node and adjust a number of output drivers in response to the impedance of the node, or analyze a resultant waveform of the node, caused by an input waveform, and adjust a number of output drivers in response to the resultant waveform of the node.

Embodiments of the present invention try and determine the impedance of the load to which the off-chip driver is connected. Generally, a designer will make some determination as to whether a load will be largely resistive or largely capacitive. The current invention will then automatically determine the resistance or capacitance, respectively, of the load and configure the off-chip driver to best match the impedance, or to match a fraction of the impedance, should the system design choose to slightly over- or under-drive the load.

Additionally, another embodiment of the present invention attempts to change the system's response to an input waveform. In this embodiment, an automatic driver adjuster couples an input waveform to the load and then measures the resultant waveform. By varying the number and/or strength of drivers in an off-chip driver, the resultant waveform can be modified to meet criteria set by the designer. This embodiment is more of an empirical approach than are the embodiments discussed in the previous paragraph.

It should be noted at this point that an "off-chip driver" generally has several or many smaller drivers. These smaller drivers are commonly called "fingers". The off-chip driver is the entire system of smaller drivers, and is intended to drive one signal off-chip.

Figure 1:
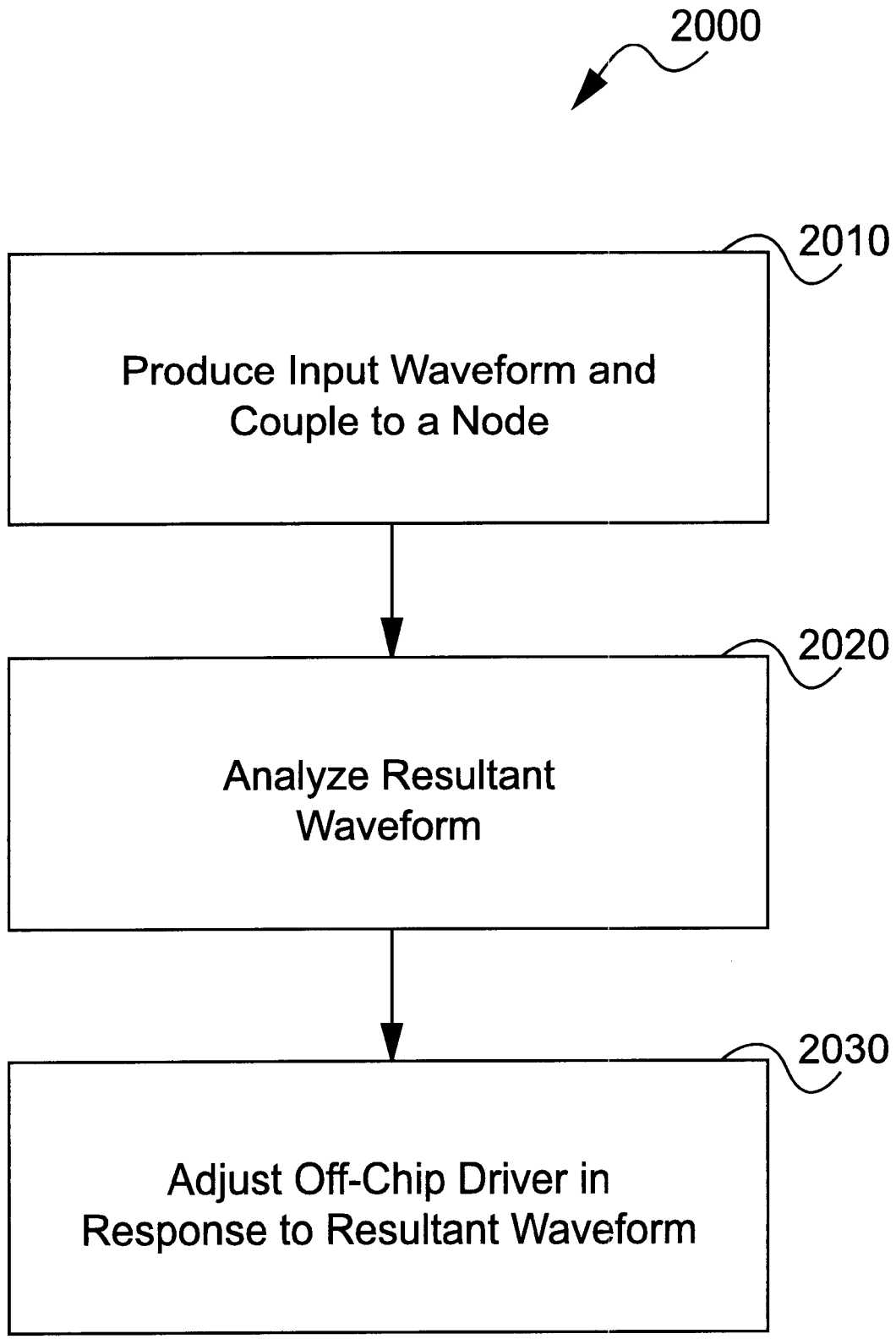
FIG. 1 is a preferred method for automatically adjusting an off-chip driver in accordance with a preferred embodiment of the present invention.

Turning now to FIG. 1, this figure has a block diagram of a preferred method for automatically adjusting an off-chip driver, performed by an automatic driver adjuster. Method 2000 is preferably performed at startup, such that each time the device is powered on (or reset, if desired), the off-chip drivers will be automatically adjusted. Alternatively, a number of other options are available. For instance, the method could be software configurable, such that a software command causes the method to be performed. The method could be performed at a regular schedule or if the temperature changes to a certain amount. The method could be performed at any time there may be an off-chip driver to load mismatch, such as after adding or changing loads, after reaching operating temperature, or after a service repair. There could be Input/Output (I/O) pins that go off-chip or registers readable and configurable off-chip, to allow a designer to cause method 2000 to be performed, or determine the configuration of the driver, or, in certain instances, to change the configuration of the automatic driver adjuster.

Additionally, while it is beneficial to perform method 2000 at least periodically, to account for unforeseen changes in load impedance, it is also possible to perform method 2000 once and then permanently set the off-chip driver to a particular configuration. This could be performed through on-chip fusing by electronic or laser fuse technology or through mask wiring or module wiring, for example.

Method 2000 begins in step 2010 when an input waveform is produced and coupled to a node. The node will be coupled to an output pad, and will be at the same potential at the output pad. The output pad is connected through a lead to an off-chip circuit. The off-chip circuit will generally have one or more small loads, and can have various termination resistors and transmission line impedances, similar to the example shown in FIG. 12. Unless discussed in more specific terms, the term "load" will refer to all impedances created by small loads, transmission line impedances, and other impedances connected to the node, which is essentially the impedance "seen" by the off-chip driver.

The type of input waveform produced will depend on the type of analysis performed in later steps and the type of load to which the off-chip driver is expected to be mated. For instance, if the off-chip driver is expected to be mated to a load that is primarily resistive, then the input waveform will be a small Direct Current (DC) current. By "primarily resistive," it is meant that the resistance of the load is much more significant than other impedances. If the off-chip driver is expected to be mated to a load that is primarily capacitive, then the input waveform can also be a small DC current. By "primarily capacitive," it is meant that the capacitance of the load dominates the load impedance. In particular, this means that the phase angle should be negative such that the total reactance is dominated by the capacitance.

In the case of primarily capacitive loads, it is important to keep the current small or else transmission line effects (ringing, oscillations, phase differences, etc.) will be created that will interfere with a proper analysis. One of the problems with analyzing a load is that the analysis is very frequency dependent. So, if one was to drive a very fast pulse onto the node, then any transmission lines will act like transmission lines, and there will be a number of reflections and other deleterious effects. On the other hand, if one was to drive a small current onto the node, the drive level and voltage change should be small. For primarily capacitive loads, it is preferred that a test current be injected onto the node at a low enough value to evoke low frequency response from the system. These low frequencies are chosen to avoid any transmission line effects. If the load is more complex, then the input waveform will be a pulse waveform that will be applied to the system a number of times. Generally, this pulse waveform will be a square-wave, although other waveforms are possible.

In step 2020, the resultant waveform is analyzed. This analysis depends on the type of load to which the off-chip driver is attached. If the load is primarily resistive, it is beneficial to match the off-chip driver's strength to the resistance of the load: a higher load resistance requires a driver with higher source resistance ($R_s$), while a smaller load resistance requires a driver with lower $R_s$. The input waveform, in step 2010, is a small current. By measuring the resultant voltage on the node (connected to the output pad and therefore to the load), the resistance can be estimated by using the well-known formula, Voltage=Current multiplied by Resistance (V=IR). Specific circuits for performing this measurement and method 2000 will be shown in reference to later figures. The off-chip's driver's strength, and therefore its source impedance, may be adjusted by enabling drivers (step 2030). By "enabling" it is assumed to mean that the drivers that are not enabled are disabled. The number of drivers may be increased or decreased in this manner, thereby increasing or decreasing, respectively, the off-chip driver's source impedance and strength. Alternatively, certain stronger or weaker drivers may be selected to increase or decrease, respectively, the off-chip driver's source impedance and strength.

If the load is primarily capacitive, it is beneficial to match the off-chip driver's strength to the capacitance of the load: a larger capacitance requires a larger-strength driver, while a smaller capacitance requires a smaller-strength driver. The input waveform, in step 2010, may again be a small DC current. By measuring the resultant voltage on the node (connected to the output pad and therefore to the load), the capacitance can be estimated by using the formula, Capacitance=Current multiplied by Time and divided by Voltage (C=IT/V). Specific circuits for performing this measurement and method 2000 will be shown in reference to later figures. The off-chip's driver's strength, and therefore its source impedance, may be adjusted by enabling drivers (step 2030). By "enabling" it is assumed to mean that the drivers that are not enabled are disabled. The number of drivers may be increased or decreased in this manner, thereby increasing or decreasing, respectively, the off-chip driver's source impedance and strength. Alternatively, certain stronger or weaker drivers may be selected to increase or decrease, respectively, the off-chip driver's source impedance and strength.

If the load is complex or of an unknown impedance, a more empirical method may be used instead of trying to match impedances. In this technique, an input waveform is driven onto the node (step 2010), and the resultant waveform is analyzed (step 2020). Most preferably, the input waveform is a pulse that is a square wave and that can be cycled a number of times. The resultant waveform is analyzed by determining if it meets a predetermined voltage specification. In particular, the predetermined voltage specification will preferably determine the amount of allowable overshoot, undershoot or ring back of the resultant waveform. In one preferred method, the amplitude of the overshoot or undershoot of the resultant waveform is measured. These amplitudes are compared to high and/or low levels. Another preferred method is to measure the ring back amplitude. For example, if, after a negative transition, a voltage waveform goes below $V_{OL}$ and rings back above $V_{OL}$, the amplitude of the ring back could be a measure of the driver's Rs matching to the load.

Most preferably, the predetermined voltage specification will have two specifications for positive and negative allowable overshoot or undershoot. By passing multiple pulses though the node, the amount of undershoot or overshoot can be changed to best fit the required specifications. Specific circuits for performing this measurement and method 2000 will be shown in reference to later figures. The off-chip's driver's strength, and therefore its source impedance, may be adjusted by enabling drivers (step 2030). By "enabling" it is assumed to mean that the drivers that are not enabled are disabled. The number of drivers may be increased or decreased in this manner, thereby increasing or decreasing, respectively, the off-chip driver's source impedance and strength. Alternatively, certain stronger or weaker drivers may be selected to increase or decrease, respectively, the off-chip driver's source impedance and strength.

As previously discussed, in step 2030, the off-chip driver is adjusted in response to the resultant waveform. For the cases of primarily capacitive or resistive loads, the number and/or strength of drivers are adjusted to best match the impedance of the load or to match a fraction of the impedance of the load, should the designer wish to have the off-chip driver slightly over- or under-damped. In the case of complex or unknown loads, the number and/or strength of drivers are adjusted to meet a predetermined voltage specification. In particular, the number and/or strength of positive or negative drivers may be adjusted to change the amount of overshoot or undershoot, respectively, or ring back.

Method 2000, thus, allows an off-chip driver to be automatically configured to an appropriate strength and impedance for its present load. It should be noted that method 2000 is preferably used for off-chip drivers that drive signals from the chip onto the attached system. However, the method may also be used to lessen the amount of ground and power bounce and other deleterious conditions on these pad and other pads.

Figure 2:
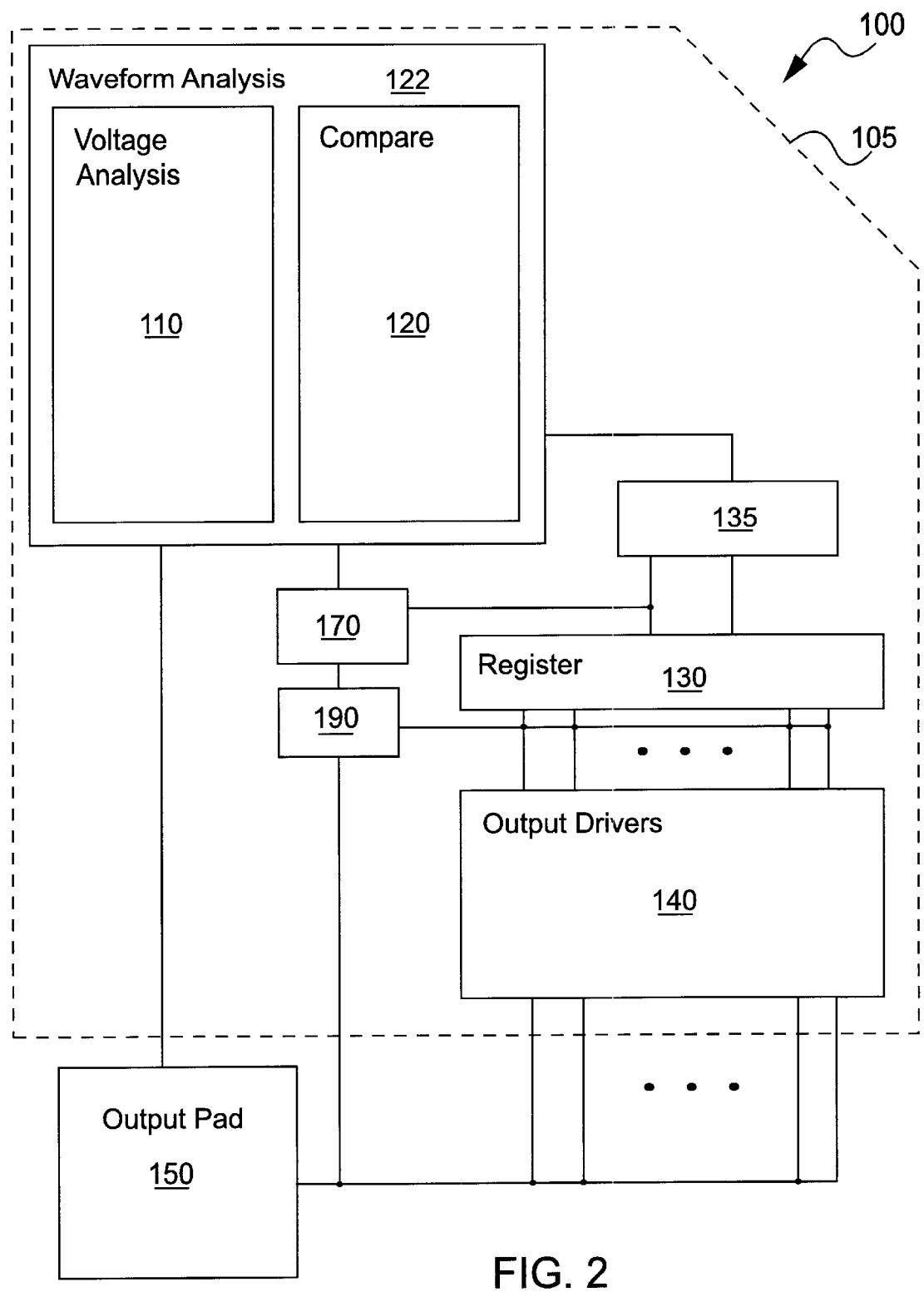
FIG. 2 is an overview block diagram of an automatic driver adjuster in accordance with a preferred embodiment of the present invention.

Turning now to FIG. 2, this figure shows an overview of the preferred mechanism for automatically adjusting an off-chip driver. This figure shows a chip portion 100 that has an automatic driver adjuster 105 and an output pad 150. The automatic driver adjuster 105 comprises a waveform analysis mechanism 122 that itself comprises voltage analysis mechanism 110 and a compare mechanism 120, combinatorial logic 135, register 130, a waveform generator 190, a control circuit 170, and output drivers 140. Automatic driver adjuster 105 is coupled to an output pad 150, which for this example may be thought of as a node. Combinatorial logic 135 and register 130 are optional but preferred in some instances. Waveform generator 190 may be connected to output pad 150 or to output drivers 140, depending on the embodiment and the designer's preferences.

Control circuit 170 performs and sets any timing requirements are necessary to perform the adjustment of the driver and the analyses. Additionally, control circuit 170 directs the automatic driver adjuster to perform the adjustment of the off-chip driver, and as such may be told to perform the adjustment at various times, as described above. Specifically, the control circuit could be made to run periodically, at startup, at a software-configurable time, etc. Waveform generator 190 produces the appropriate waveform for the particular expected load, and waveform analysis block 122 then analyzes the resultant waveform. Most preferably, this analysis comprises a voltage analysis (mechanism 110) and a compare analysis (comparison mechanism 120). Voltage analysis block 110 compares the resultant voltage with predetermined voltages, while compare block 120 compares the resultant waveform voltages with predetermined criteria.

Combinatorial logic 135 is optional but useful in some situations. For example, combinatorial logic may be useful for capacitance measurements, because the voltage rise in a system that is primarily capacitive can be non-linear. Additionally, should different strength drivers be used, some combinatorial logic might be useful to properly select the appropriate drivers. Moreover, having combinatorial logic allows having a certain sequence of testing to ensure that the proper off-chip driver strength is chosen. Combinatorial logic 135 is, however, optional.

Register 130 is one way of storing the appropriate off-chip driver configuration. If the automatic driver adjuster decides that particular drivers are to be used, the register can enable these drivers. This allows the automatic driver adjuster 105 to run its analysis and adjustment once and then remain configured until the next analysis and adjustment. Register 130 is optional, particularly because it may be desired to have the automatic driver adjuster run once and then permanently configure the off-chip driver.

Output drivers 140 are multiple drivers that may be enabled or disabled. Each transistor that makes up a driver is commonly referred to as a "finger", and there could be many or few fingers per driver. After analysis, it is preferred that the driver configuration be stored in a configuration register, although more permanent methods may be used to store the configuration. During analysis, the control circuit 170 or the combinatorial logic 135 can enable the drivers, if enabling the drivers is needed, until the proper driver configuration is determined. The drivers may be of equal or of unequal strength. To create drivers of unequal strength, an enable may be used to turn on multiple drivers of equal strength, or stronger and larger individual drivers may be used.

Thus, FIG. 2 shows a very configurable automatic driver adjuster that can perform method 2000. Additionally, the automatic driver adjuster 105 may be run at multiple times or whenever a designer desires it to be run, such that the driver will always be matched to its load.

Figure 3:
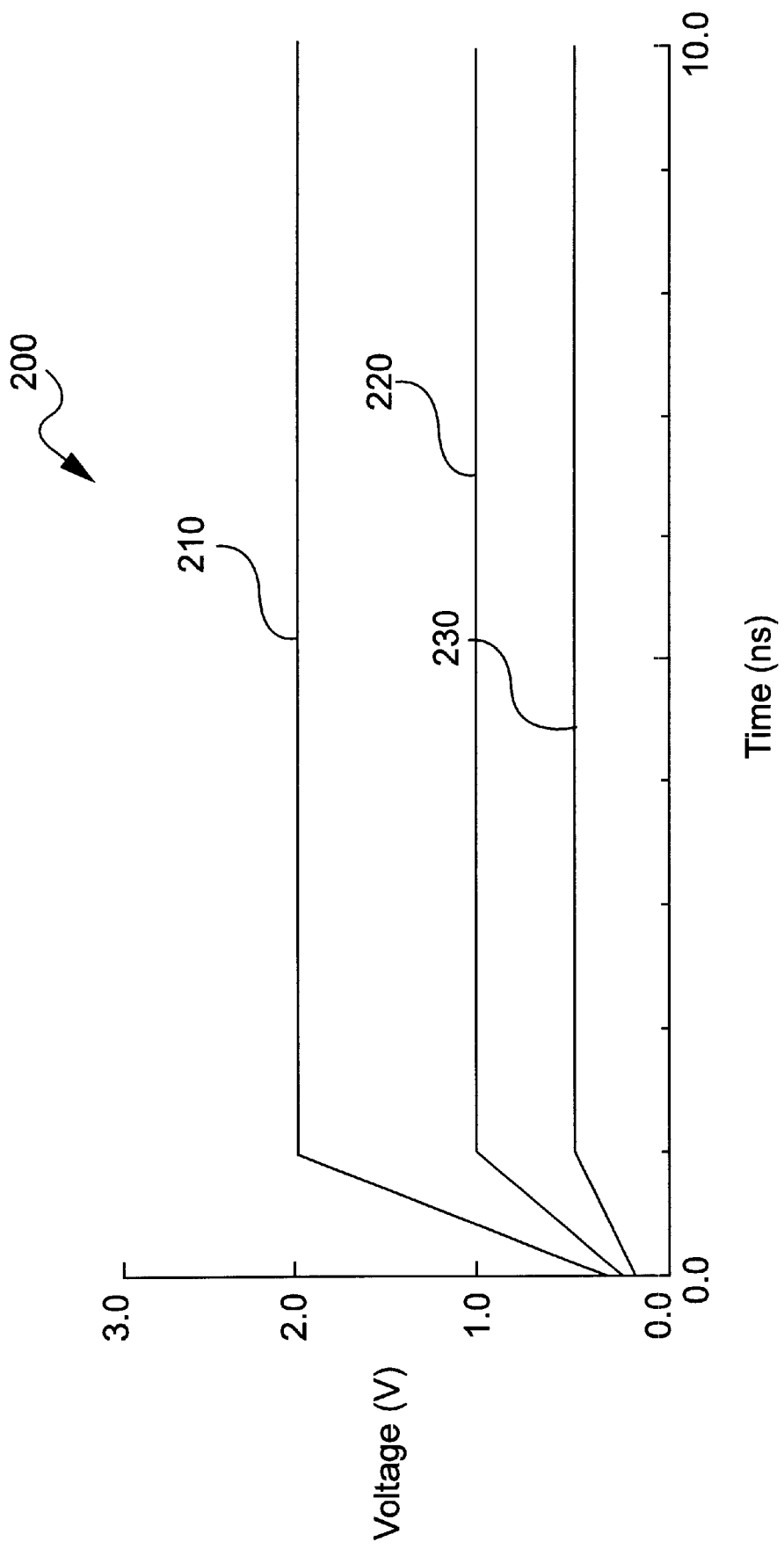
FIG. 3 is an example node response to a current source when the node is primarily resistive.

Turning now to FIG. 3, this figure shows system responses to 20 milliamps (mA) of current into various resistively terminated loads. Graph 200 shows the responses to 20 ma of current through 100 ohms (curve 210), 50 ohms (curve 220), and 25 ohms (curve 230). The resultant voltage is shown on the ordinate, while the time (in nanoseconds) is shown on the abscissa. Graph 200 is a theoretical graph with nodes having some capacitance and inductance. Curve 210 stabilizes at about 2 volts, curve 220 stabilizes at about 1 volt, and curve 230 stabilizes at about 0.5 volts. FIG. 3 illustrates that it is possible to couple a DC current, as an input waveform, onto a node that is primarily resistive and measure the resultant waveform, which should be a flat voltage (after some period has passed). This flat voltage may be measured and the impedance—in this case, the resistance—of the load may be measured. The off-chip driver's strength may be adjusted by selecting an appropriate number and/or strength of drivers. More drive strength will be necessary to drive a lower resistance, while less drive strength will be necessary to drive a higher resistance.

Figure 4:
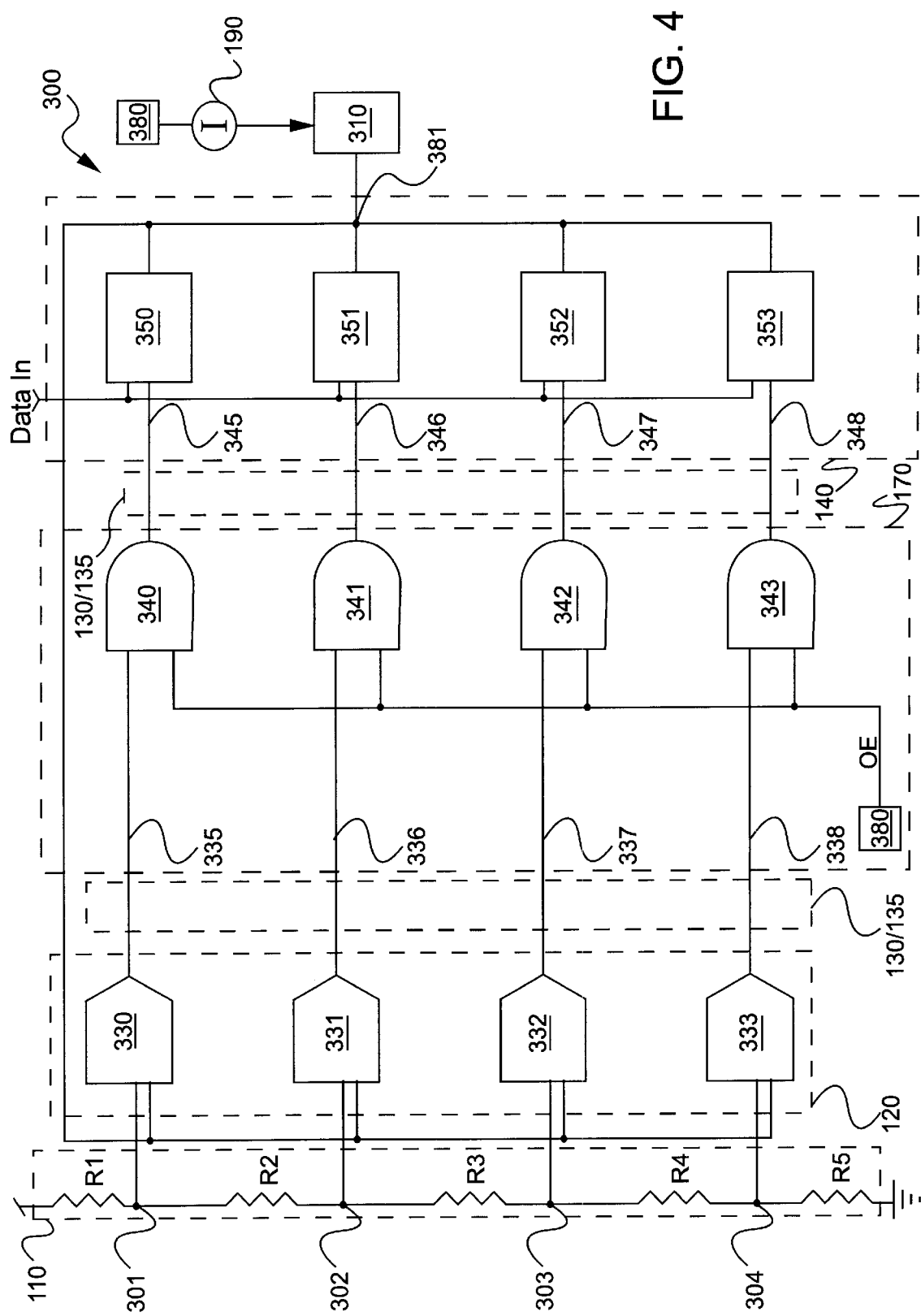
FIG. 4 is an automatic driver adjuster that automatically adjusts to load resistance in accordance with a preferred embodiment of the present invention.

Turning now to FIG. 4, FIG. 4 shows a preferred automatic driver adjuster 300 that adjusts off-chip drivers to match a primarily resistive load. The automatic driver adjuster 300 is coupled to an output pad 310. In this example, automatic driver adjuster 300 comprises a voltage divider network R1 through R5 that performs a voltage analysis, a number of voltage comparators 330, 331, 332, and 333, a number of AND gates 340, 341, 342, and 343, a number of drivers 350, 351, 352, and 353, a current source 190, and timer 380. Outputs 345, 346, 347, and 348 are coupled to the drivers and enable the drivers. Outputs 335, 336, 337, and 338 of the voltage comparators are inputs to the AND gates and will be combined with an output enable (traveling through timer 380) to enable or disable the drivers. Optionally, combinatorial logic 135 and/or register 130 may be added at the indicated locations (although other locations are possible).

In simple terms, the embodiment of FIG. 4 passes DC current onto pad 310, waits a period of time for transients to die down, compares the output pad's voltage (at node 381) with pre-determined voltage levels, enables the output drivers, then stores the output driver configuration for use until the next automatic driver testing and configuration. The time for the transients to die downs should be only about 10 nanoseconds (ns), although longer periods, such as 100 ns, may be used.

In this simple example, the control system is a timing mechanism 380 that will enable the adjustment system at a beginning time after startup. As previously discussed, the beginning time is selected to allow the current source 190 to force a DC current to output pad 310 and to allow for any transient responses to die down. After this predetermined time, the timer 380 enables the automatic driver adjuster for a certain period to allow the automatic driver adjuster to analyze the resultant waveform. The timer then disables the automatic driver adjuster, including current source 190, once analysis and off-chip driver configuration are complete. More complex control systems are possible, including having multiple timers, having an addressable register that can tell the automatic driver adjuster when to run, etc.

In this embodiment, current source 190 produces a DC current. Automatic driver adjuster 300 couples this to the output pad 310, which is connected to node 381. Node 381 is also connected to the inputs of voltage comparators 330 through 333. In this example, there are only four sets of voltage comparators, enables, and drivers, but there could be more or less of each of these. Each voltage comparator compares the node voltage with a reference voltage produced by the voltage divider network of R1 through R5. If the node voltage is greater than the reference voltage, the voltage comparator produces a disable signal to disable its associated driver.

As a specific example, if the source voltage was 3 volts, and if R1 was 7000 ohms, and each of R2, R3, R4 and R5 was 2000 ohms, the reference voltages at locations 304, 303, 302, and 301 would be as follows: 400 millivolts (mV); 800 mV; 1200 mV; and 1600 mV. Using the example of FIG. 3, an automatic driver adjuster that couples a 20 mA to node 381, and node 381 is connected to 25 ohm load, a resultant voltage of approximately 500 mV will result. This will cause disable line 338 to activate, but all other disable lines will be inactive. Therefore, drive 353 will be inactive and all other drivers will be active.

If the load resistance is 50 ohms, however, the resultant voltage will be about 1 Volt (V). This resultant voltage will cause disable signals 337 and 338 to be active, while disable signals 335 and 336 are inactive. Thus, two drivers (driver 352 and 353) will be disabled. If the load resistance is 100 ohms, the resultant voltage will be about 2 V. This resultant voltage will cause all the disable signals to be active. Thus, all four drivers will be disabled and a minimum drive level can be sustained by a non-adjustable driver (not shown in FIG. 4) in parallel with the adjustable drivers discussed above.

In the latter example, resistors R2 through R5 were all the same value. However, this need not be the case, particularly if different strength drivers are used. For example, R5 and R4 could be made small if it was known that the most likely load resistance would also be small. In this discussion, it should be noted that "small" and "large" are relative to some or all of the other resistor's values. Their corresponding drivers 352 and 353 could also be made with small Rs. It could be that R2 could be made quite large, so that a large Rs driver 350 may be used for high resistance loads. Alternatively, perhaps it would be known that the resistance of the load would be centered around 100 ohms. Then, R5 could be made larger, along with the Rs of driver 353, to more closely match the expected load impedance. Hence, the reference voltage and respective driver Rs can be tailored to provide fine adjustment around a predetermined load impedance range. Or a coarser adjustment may be made over a larger impedance range.

Combinatorial logic may be useful in many cases. It is possible that drivers 350 through 353 could each be made with varying Rs. This would allow the combinatorial logic 135 to best select the drivers to provide the appropriate Rs for a given load resistance. In particular, drivers with binary-weighted Rs may be used. For instance, drivers 350 through 353 could have resistance values of 2, 4, 8, and 16 ohms, respectively. This would allow selections of driver resistance from 2 ohms to 30 ohms. This also allows 2 ohm resolution between the selectable driver Rs. There could be a sequence programmed into combinatorial logic 135 such that it will know, for any resultant voltage, what the best selection of drivers is. The combinatorial logic also allows the designer to build in a certain margin for error. Exemplary locations for combinatorial logic 135 are shown in FIG. 4, although other locations are possible.

Additionally, the automatic driver adjuster 300 should retain its driver settings once the off-chip driver's adjustments have been finalized. In order to retain settings, the off-chip driver could be permanently adjusted after a first adjustment, such as by using fuse technology. Most preferably, the automatic driver adjuster would have a register 130 that would define which drivers are enabled. This would allow the automatic driver adjuster to retain a particular configuration between adjustments. Moreover, the register could be addressable, so that a designer could determine the configuration of the off-chip driver. Exemplary locations for register 130 are shown in FIG. 4, although other locations are possible.

Thus, FIG. 4 illustrates a preferred automatic driver adjuster that adjusts an off-chip driver's strength to match a primarily resistive load.

Figure 5:
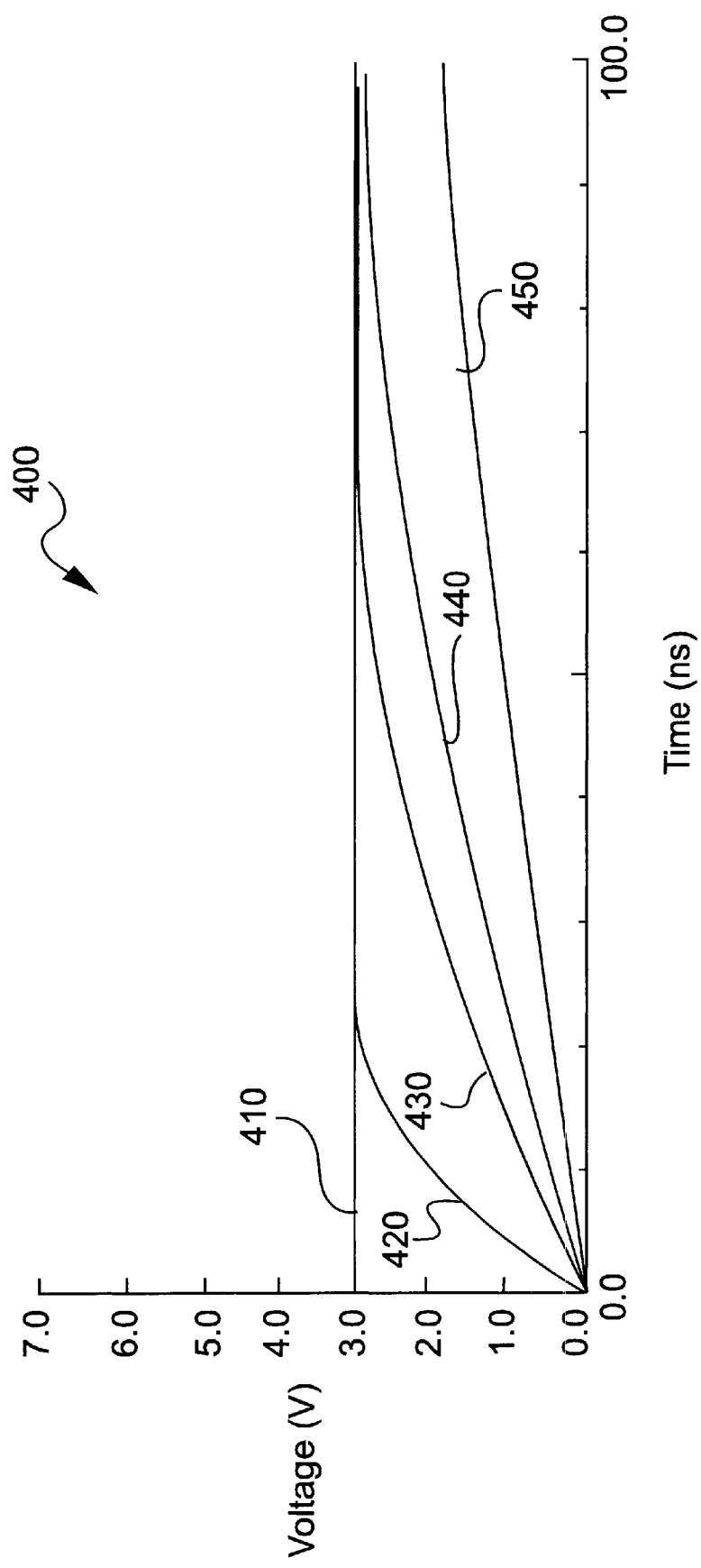
FIG. 5 is an example node response to a current source when the node is primarily capacitive.

Turning now to FIG. 5, this figure shows a graph 400 of several theoretical response curves for different loads. In this system, a 2 mA DC signal was coupled to primarily capacitive loads having the following capacitances: 10 picofarads (pf), curve 420; 30 pf, curve 430; 50 pf, curve 440, and 100 pf, curve 450. Curve 410 indicates the compliance voltage level. There was a minor amount of resistance and inductance in each load. It took the following times for the following curves to reach 1.5 volts: 7.5 ns for curve 420; 22.5 ns for curve 430; 37.5 ns for curve 440; and 75 ns for curve 450.

FIG. 5 illustrates that it is possible to estimate the capacitance of a primarily capacitive load by determining how long it takes to reach a particular voltage in response to a DC current. Note that it is important that a small test current be used for this determination, so as to avoid transmission line effects. A test current is appropriately small enough when it evokes a system response with a rise or fall time that is slower than twice the propagation delay of any transmission line in the system. For example, if a circuit board trace, or coaxial cable has a characteristic impedance ($Z_0$) equal to 50-ohms, and a propagation velocity (v) and a length (l), then the signal delay time is equal to v*l for signals with rise or fall times faster than 2*v*l. This line will behave as a 50-ohm transmission line and reflect energy back and forth along its length only for stimuli faster than 2*v*l. For stimuli slower than 2*v*l the wire and load behave as a lumped load which permits calculation of load capacitance without the disturbance of transmission line effects.

In the case of the exemplary capacitances in FIG. 5, determining the time to reach 1.5 volts determines the capacitance of the load for loads that have impedances that are primarily capacitive. Additionally, for capacitances that are close in value, it may be beneficial to choose several voltages to make this determination. For example, curves 430, 440, and 450 are all very similar in the low voltage ranges.

Figure 6:
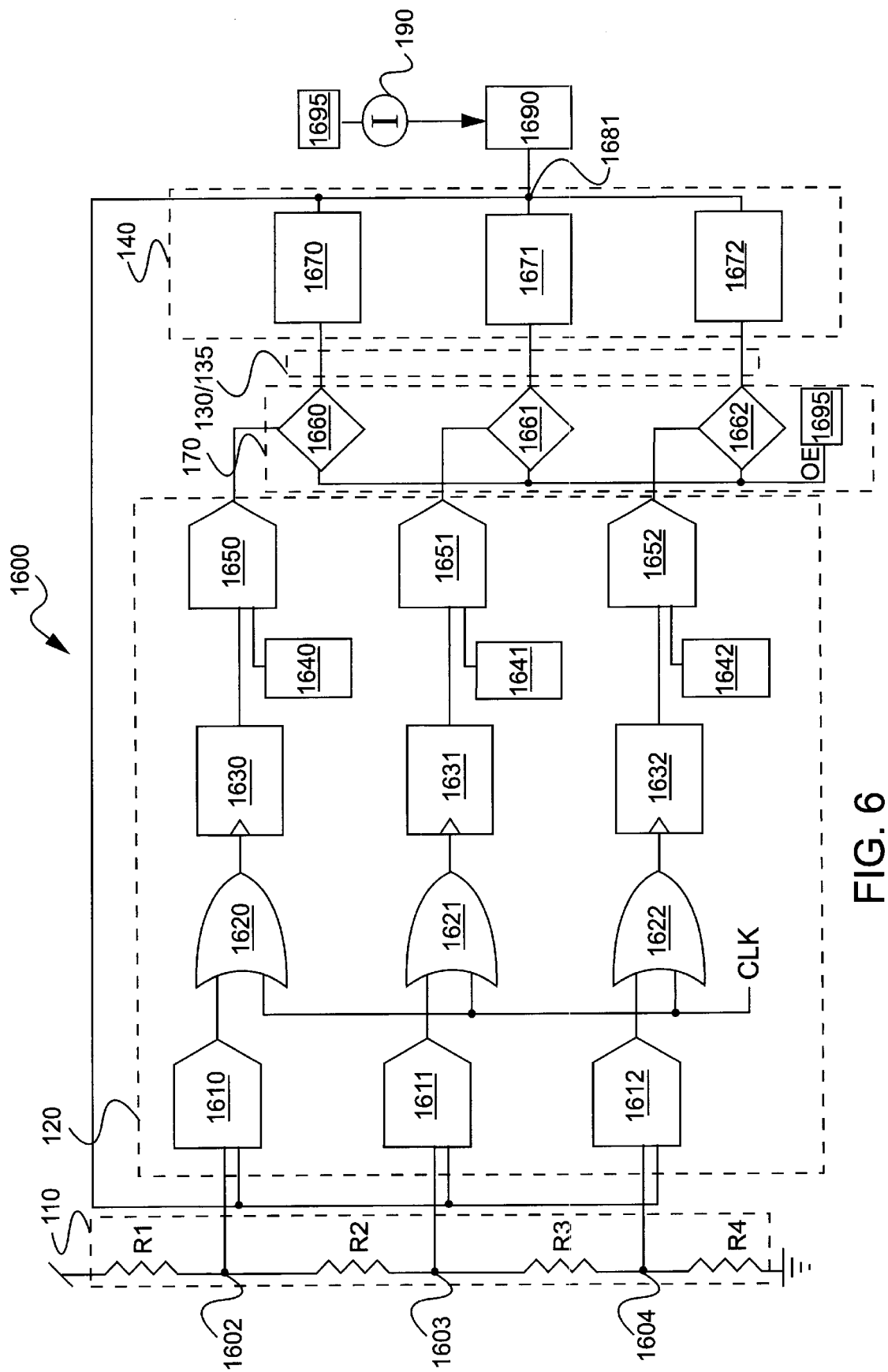
FIGS. 6 and 7 are an automatic driver adjuster that adjusts to load capacitance in accordance with a preferred embodiment of the present invention.

Turning now to FIG. 6, this figure illustrates a preferred automatic driver adjuster 1600 that can analyze and determine the impedance of a node and adjust the off-chip driver's output drivers in response to the impedance of the node. In this embodiment, the impedance of the node is expected to be primarily capacitive, and the automatic driver adjuster 1600 will determine the capacitance of the node by determining the times taken to reach certain voltages.

Automatic driver adjuster 1600 is coupled to output pad 1690 through node 1681. Automatic driver adjuster 1600 comprises a number of resistors R1, R2, R3, and R4 that perform voltage analysis, a number of comparators 1610, 1611, 1612, counters 1630, 1631, 1632, registers 1640, 1641, 1642, comparators 1650, 1651, 1652, enables 1660, 1661, 1662, drivers 1670, 1671, 1672, DC current source 190, and timer 1695.

Essentially, the automatic driver adjuster 1600 forces a DC current onto pad 1690, counts the time to reach a number of voltages (to which points 1602, 1603, and 1604 will reach), compares the various counts with predetermined register values, and enables particular drivers. The automatic driver adjuster 1600 estimates capacitance through the equation capacitance is equal to the current multiplied by the time and divided by the voltage (C=IT/V). Because current, voltage, and time are known or predetermined, the automatic driver adjuster simply determines an approximate capacitance by comparing how long it takes to reach particular voltages with predetermined time periods. In this embodiment, it is important that a low value of current is used to eliminate transmission line effects. In this embodiment (and the embodiment of FIG. 7), load capacitance is translated to time, and time is represented by a numeric count of a periodic clock signal. A specific numeric count must be reached to enable a specific driver. In this method, a proportion of load capacitance to driver Rs can be designed for by adjusting voltage reference levels, drive comparator register count, counter preconditioning, and driver Rs.

Timer 1695 may be used to disable the automatic driver adjuster, including current source 190, after an appropriate time period has elapsed. Note that timer 1695 may also be used to enable or disable register 130 or combinatorial logic 135, cause the register to latch in its current configuration, or reset part or all of automatic driver adjuster 1600.

R1 through R4 are selected to allow various voltages to be determined at points 1602, 1603, and 1604. Each of the comparators 1610 through 1612 produces a positive output if the voltage of node 1681 is greater than the comparator's respective voltage at one of the points 1602, 1603, and 1604. For instance, if the power supply voltage is three volts and R1 through R4 are chosen such that the voltage at point 1603 is 1.5 volts, comparator 1611 will produce a low voltage on its output until the node 1681 voltage is above 1.5 volts, when comparator 1611 will produce a high voltage on its output. Counters 1630 through 1632 are preferably cleared prior to analysis. Each of the counters 1630 through 1632 then counts each clock pulse as long as its associated comparator is producing a low voltage. For example, counter 1632 will continue to count up (or down, if desired) until comparator 1612 produces a high. This high essentially blocks the clock signal, meaning that counter 1632 will no longer count.

Each comparator 1650 through 1652 will not enable its associated enable (1660 through 1662) unless its associated counter 1630 through 1632 is greater in value than the value preloaded into its associated register 1640 through 1642. For instance, comparator 1652 will not produce an enable signal unless the count in counter 1632 is greater than the preloaded count in register 1642. Each enable will then enable its respective driver.

In the case of a light (10 pf) load, the counts in counters 1630 through 1632 should be small. Thus, few drivers will be enabled. On the other hand, in the case of a high (100 pf) load, the counts in counters 1630 through 1632 will be large. Thus, more drivers will be enabled. For automatic driver adjuster 1600, the number of counts is proportional to the capacitance.

Combinatorial logic 135 may be used to enable particular drivers, if different strength drivers are used. The combinatorial logic 135 may also be used in other situations. For example, if the automatic driver adjuster is connected to an extremely low capacitance load, it could be possible that no drivers will be enabled. In this instance, the combinatorial logic would enable a parallel non-adjustable driver (not shown in FIG. 6) of minimum drive strength. Moreover, it is possible that drivers 1670 through 1672 could each be made with binary-weighted strengths, as previously discussed. This would allow the combinatorial logic 135 to best select the drivers to provide the appropriate strength for a given load capacitance.

Register 130 preferably maintains the configuration of drivers. Register 130 will maintain this configuration until the adjustment analysis of the automatic driver adjuster is performed again. This allows the configuration register to properly configure the off-chip driver. It should be noted that the configuration register could be made such that it is non-volatile, if this is desired. Additionally, the configuration could be permanent, by using fuse or other technology.

Figure 7:
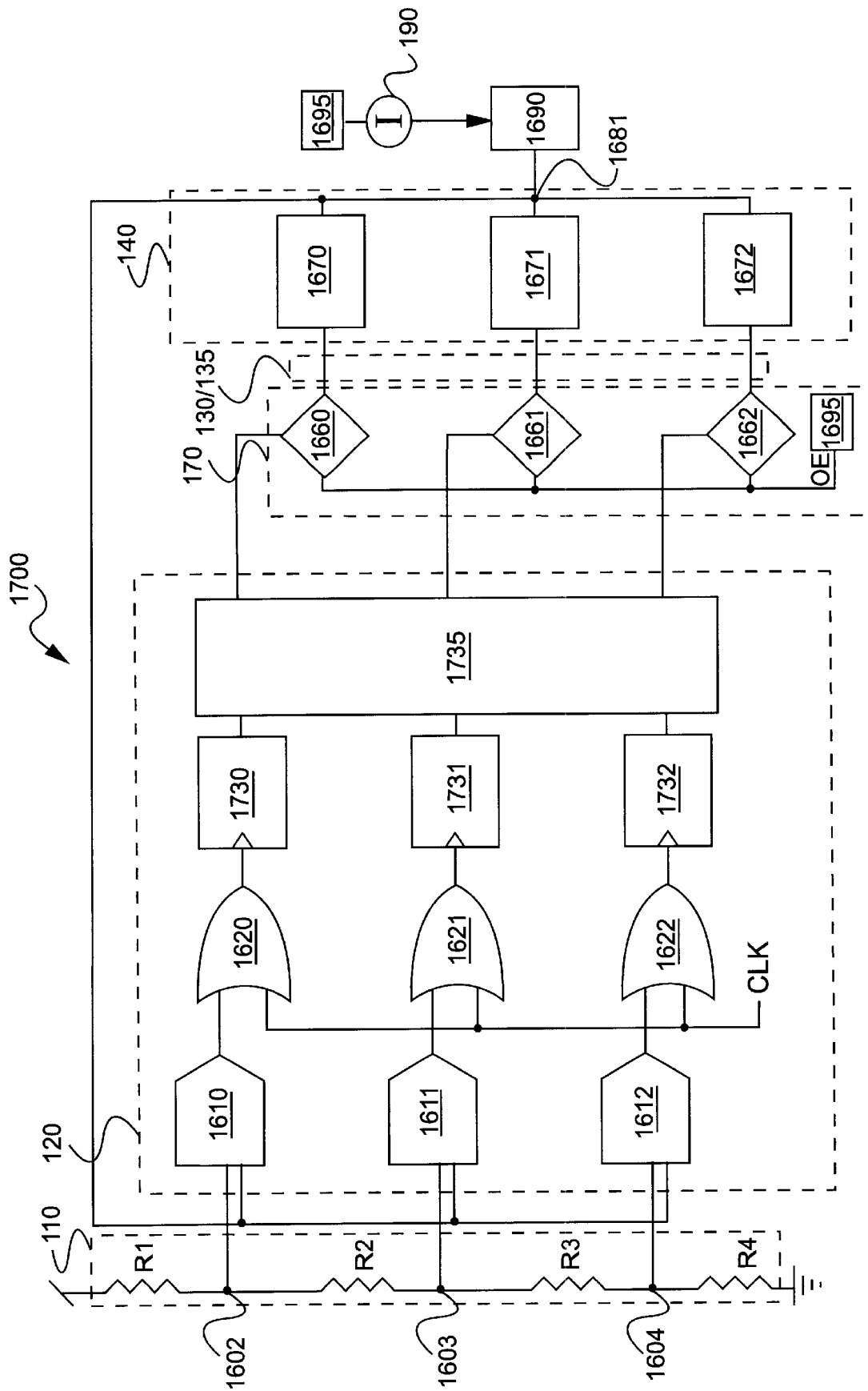

Turning now to FIG. 7, this figure shows another preferred automatic driver adjuster that adjusts off-chip driver strength based on capacitance. This automatic driver adjuster 1700 is basically automatic driver adjuster 1600, only with a few minor modifications. Only the modifications will be discussed herein.

In this embodiment, counters 1730, 1731, and 1732 are preloaded or preconditioned with a value. This number is decremented (or incremented) until the counter has counted a specific number of counts. For example, if there are a positive 2000 counts in the counter, the counter will count until the 2000 th count is reached. Then combinatorial logic 1735 will determine that this event has occurred and enable a driver. For instance, combinatorial logic 1735 could wait until all bits of the counter are zero, or could wait until the most significant bit of the counter is a one (in the case where the counter counts below zero and the value in the counter is negative). Many other versions are possible, but these versions have the effect of determining how long it takes to reach a particular voltage level. This time is proportional to the capacitance of the load.

Thus, FIGS. 6 and 7 show an automatic driver adjuster that uses the time it takes to reach a voltage as an estimate of the capacitance of the load. Based on this capacitance, the automatic driver adjuster adjusts the number and strength of drivers (and their corresponding drive fingers) to adjust the overall Rs and strength of the off-chip driver.

The previous embodiments have attempted to determine the impedance of the node, and then modify the off-chip driver to closely match this impedance. If the load has a complex impedance, however, it may not be easy to match the impedance of the off-chip driver to the load. In order to best match the off-chip driver's impedance and strength with an unknown or complex load, an input waveform can be applied to the load and a resultant waveform measured. If the resultant waveform has too much noise or is too slow, the off-chip driver can be adjusted. This process can be repeated until the resultant waveform has the optimum combination of speed and noise.

Turning now to FIGS. 8 through 11, FIG. 8 shows a preferred automatic driver adjuster 600 that analyzes a resultant waveform of a node, the resultant waveform caused by an input waveform. The automatic driver adjuster 600 adjusts the off-chip driver's output drivers in response to the resultant waveform of the node, adding more or fewer drivers to meet a predetermined waveform specification. In the most preferred embodiment, the predetermined waveform specification has two voltage levels. One of these voltage levels determines the amount of allowable positive peak or overshoot, while the other determines the amount of allowable negative peak or undershoot. Nonetheless, it is possible to only have one predetermined voltage level, either negative or positive, if desired. Additionally, it is possible to use ring back as criteria to determine the off-chip driver's strength.

Figure 9:
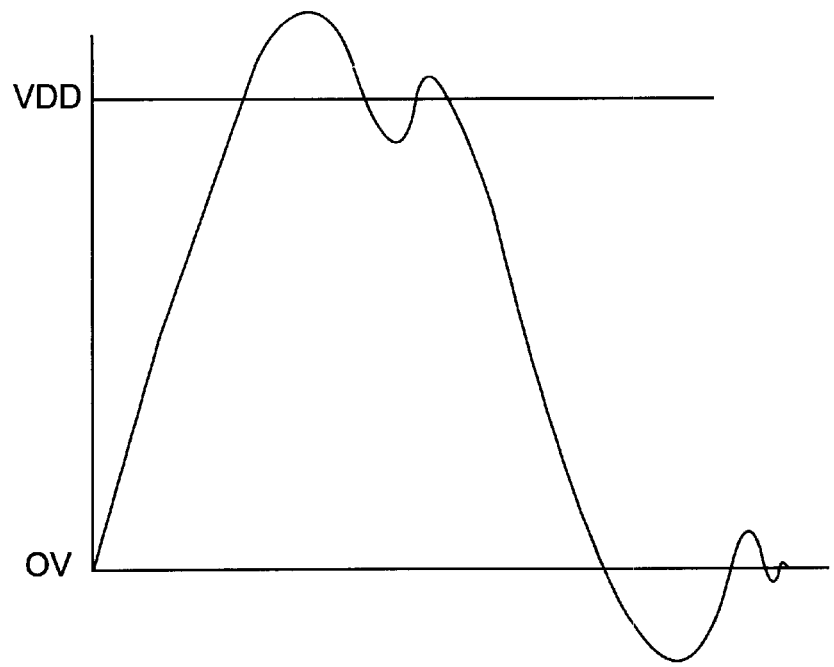
FIGS. 9 through 11 are exemplary resultant waveforms of the embodiment of FIG. 8.

FIG. 9 shows an exemplary resultant waveform. This resultant waveform is the system response to an input waveform that is essentially one pulse of a square wave. In this example, a positive peak rises to a certain voltage above the positive power supply's voltage (2.5 volts), and the negative peak falls below ground level to a certain value. As discussed in reference to FIG. 13, fast responses tend to have more oscillations and greater overshoot, undershoot and ring back, while slow responses have fewer oscillations and smaller overshoot, undershoot and ring back, but have poorer performance. Automatic driver adjuster 600 preferably attempts to modify these peaks, thereby modifying the off-chip driver's response to an appropriate combination of performance and ring back or overshoot and undershoot that are preselected or configurable by a designer.

Figure 8:
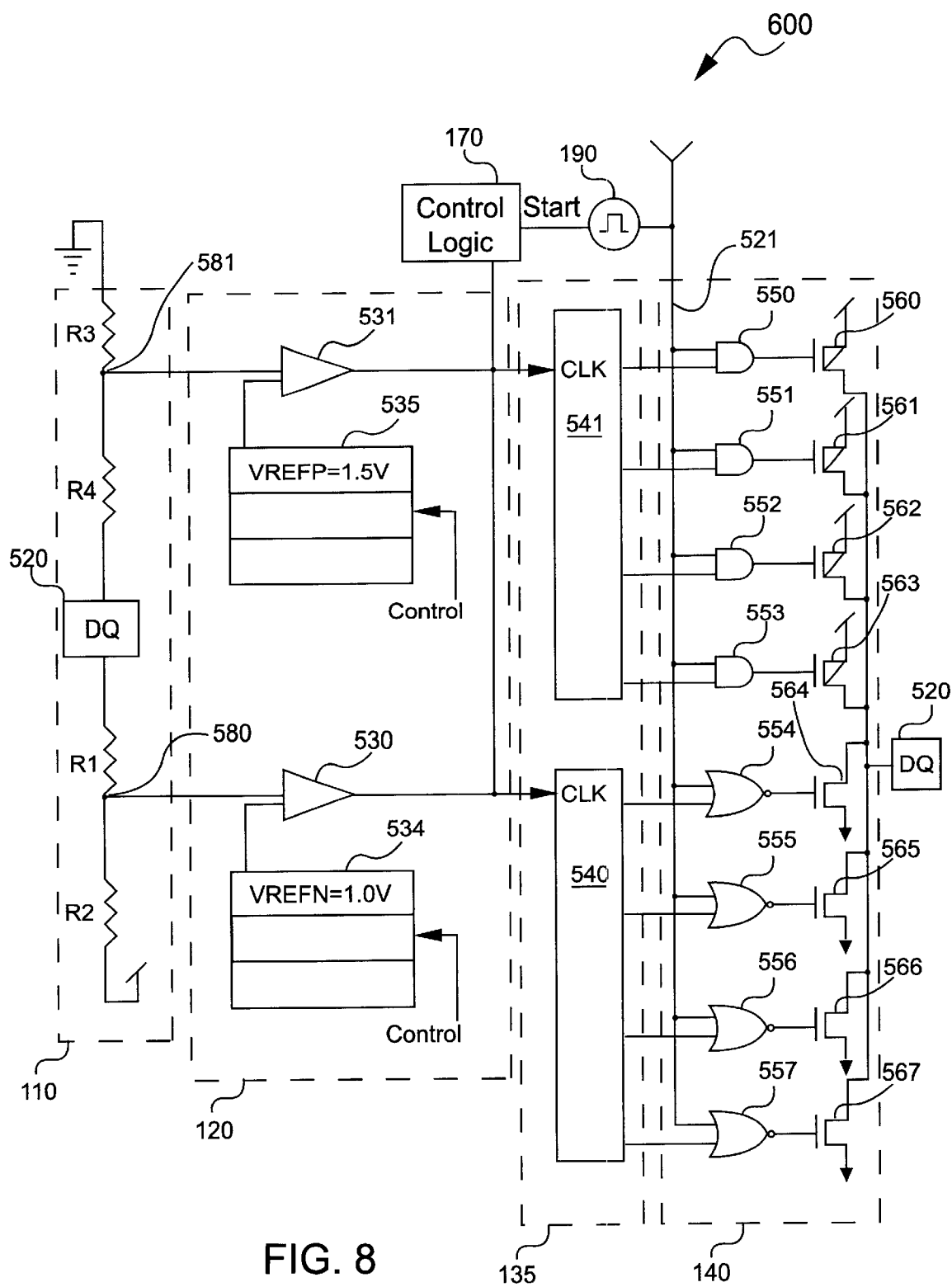
FIG. 8 is an automatic driver adjuster that adjusts to resultant waveforms in accordance with a preferred embodiment of the present invention.

In FIG. 8, automatic driver adjuster 600 comprises two voltage dividers, a first formed by R1 and R2 and a second formed by R3 and R4, two comparators 530, 531, two reference voltage selections 534, 535, two register counters 540, 541, AND gates 550, 551, 552, 553, NOR gates 554, 555, 556, and 557, several positive drive fingers 560, 561, 562, and 563, several negative drive fingers 564, 565, 566, and 567, control logic 170, a data line 521, and a waveform generator 190 coupled to the data line 521. Automatic driver adjuster 600 is coupled to an output pad 520. In this example, driver fingers (the actual driver transistors) are being used, although it is possible that multiple fingers or fingers of different strengths could be enabled per individual enable.

The waveform generator 190 generates an input waveform and the automatic driver adjuster 600 couples it to the data line 521. This input waveform is preferably a pulsed square wave that is intermittently pulsed until the desired voltage specifications are met. Initially, the automatic driver adjuster 600 enables all drivers. The positive and negative peaks are compared to their predetermined reference voltages. If both resultant voltage peaks are less than the predetermined reference voltages, then the current off-chip driver configuration is kept. If one or more of the resultant voltage peaks are greater than the predetermined reference voltage or voltages, the waveform analysis is run again, after the automatic driver adjuster 600 adjusts the off-chip driver's strength by adjusting the number and/or strength of positive and/or negative drivers.

It is preferred that automatic driver adjuster 600 be such that a designer will specify positive and negative peak reference voltages. For example, a designer might desire that both of these peaks be less than 0.6 volts. However, the automatic driver adjuster 600 might actually use different reference voltages for a voltage analysis. This is explained in more detail below.

Automatic driver adjuster 600 comprises two voltage dividers, one for the negative peak analysis and one for the positive peak analysis. The negative peak voltage divider comprises R1 and R2. The negative peak analysis is an undershoot analysis, and there will preferably be an undershoot specification that the undershoot should meet. The negative peak analysis continues with comparator 530, which compares the resultant waveform with a predetermined negative peak voltage level. Comparator 530 produces a comparison result that register counter 540 then uses to determine the appropriate selection of output drivers for the negative swing of the driver waveform. Negative drivers 564, 565, 566, and 567 determine the strength of the negative transition of the driver waveform. These drivers may each be the same strengths or may be made of different strengths. Register counter 540 can have combinatorial logic that allows different strength drivers to be chosen.

To properly determine the negative peak, it is beneficial to translate the resultant waveform's voltage to a more reasonable level, one which is preferably in the middle of the power supply's range. The resistor network R1 and R2 translates the voltage on output pad 520 to increase the relative voltage of the negative peak. For instance, in FIG. 9, the negative peak is beneath the ground level. At location 580, this same voltage, after translation by resistor network R1 and R2, is that shown in FIG. 11. As can be seen in the latter figure and assuming that R1=R2 (which does not have to be the case, but will suffice for this example), the negative peak is now less than 1.25 volts, which is the peak voltage of the power supply, divided by two.

Figure 11:
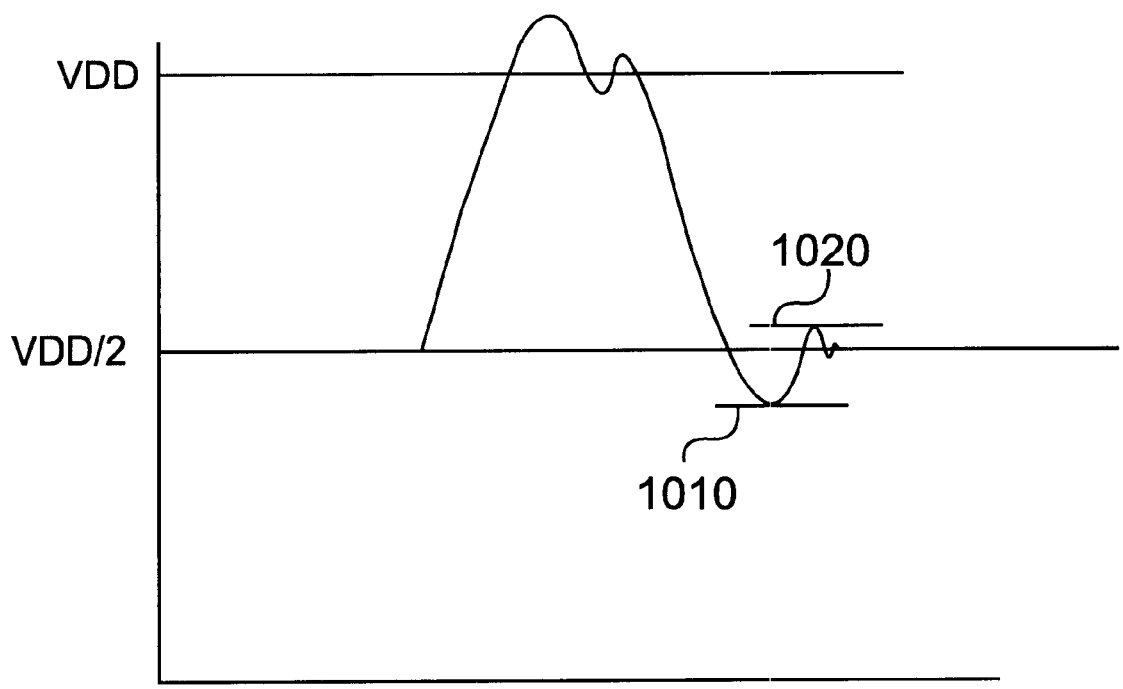

It can be seen in FIG. 11 that the resistor network has "raised" the resultant waveform to allow more accurate analysis. Level 1010 represents the level to which this negative peak fell. In this example, this level is about 1.0 translated volts. The original, un-translated negative peak voltage was −0.5 volts. The translated difference between the translated ground level of 1.25 volts and the negative peak voltage is 0.25 volts. Reference voltages in reference voltage selection 534 will preferably be translated to this translated voltage scale and will be a voltage within this scale for comparison purposes. For example, if the designer wishes the negative peak voltage to be −0.5 volts or less (where "less" means in absolute value: −0.4 volts, −0.3 volts, etc.), then the reference voltage in the reference voltage section will be 1.0 volts, which translates to −0.5 volts beneath ground.

The positive peak voltage divider of automatic driver adjuster 600 comprises R3 and R4. The positive peak analysis is an overshoot analysis, and there will preferably be a predetermined overshoot specification that the overshoot should meet. The positive peak analysis continues with comparator 531, which compares the resultant waveform with a predetermined positive peak voltage level. Comparator 531 produces a comparison result that register counter 541 then uses to determine the appropriate selection of output drivers for the positive swing of the driver waveform. Positive drivers 561, 562, 563, and 564 modify the positive part of the driver waveform, and these drivers may each be the same strengths or may be made of different strengths. Register counter 541 can have combinatorial logic that allows different strength drivers to be chosen.

To properly determine the positive peak, it is beneficial to translate the resultant waveform's voltage to a more reasonable level. The resistor network R3 and R4 translates the voltage on output pad 520 to decrease the relative voltage of the positive peak. For instance, in FIG. 9, the positive peak is above the power supply level. At location 581, this same voltage, after translation by resistor network R3 and R4, is that shown in FIG. 10. As can be seen in the latter figure and assuming that R3=R4 (which does not have to be the case, but will suffice for this example), the positive peak is now only slightly higher than 1.25 volts, which is the peak voltage of the power supply, divided by two.

Figure 10:
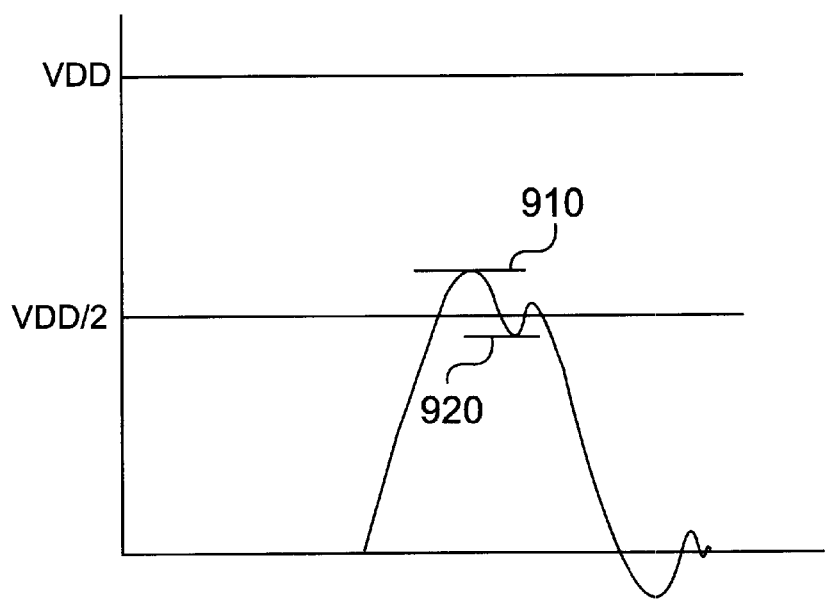

It can be seen in FIG. 10 that the resistor network has "lowered" the resultant waveform to allow more accurate analysis. Level 910 represents the level to which this positive peak rose. In this example, this level is about 1.5 translated volts. The original, un-translated positive peak voltage was 3.0 volts. The translated difference between the translated power supply level of 1.25 volts and the positive peak voltage is 0.250 volts. Reference voltages in reference voltage selection 535 will preferably be translated to this translated voltage scale and will be a voltage within this scale for comparison purposes. For example, if the designer wishes the positive peak voltage to be 0.5 volts or less, then the reference voltage in the reference voltage section will be 1.5 volts, which translates to 0.5 volts above the power supply voltage.

Control logic 170 starts the adjustment process and continues directing the waveform generator 190 to produce intermittent or periodic pulses until, after a pulse is produced, there is no clock signal from comparators 531 and 530. At this time, the control logic will stop the analysis. At this time, it is also possible that the automatic driver adjuster can cause registers 540 and 541 to latch their current configuration, if desired. Control logic 170 can also clear these registers and cause these registers to enable all drivers. This is important when starting the impedance analysis.

It should be noted that there could be several reference voltages in the reference voltage selections 534, 535. An appropriate one of these reference voltages could be selected by the designer. This selection could also occur through software programming of configuration registers (configured at power up), on-chip fusing by fuse technology, mask wiring, or by control from leads off-chip, which can be controlled remotely.

It should also be noted that the automatic driver adjuster can use ring back as an additional criteria, or use ring back as the sole criterion for adjusting the strength of the off-chip driver. For example, in FIG. 10, ring back 920 reaches a particular level beneath the translated power supply voltage of VDD/2. If the untranslated ring back falls too low, possible errors might occur. Similarly, in FIG. 11, ring back 1020 rises above the translated ground level VDD/2. If the untranslated ring back rises too high, there could be errors. The automatic driver adjuster could use reference voltage selections 534, 535 to control the ring back instead of or in addition to the overshoot or undershoot. In this embodiment, the automatic driver adjuster would have to determine the ring back and then adjust the driver fingers (or drivers, if there are drivers made of individual driver fingers) appropriately. In the positive analysis, the automatic driver adjuster would have to determine how far the ring back falls beneath VDD/2 after VDD/2 (in the example of FIG. 10) has been reached. Similarly, in the negative analysis, the automatic driver adjuster would have to determine how high the ring back rises above VDD/2 after VDD/2 (in the example of FIG. 10) has been reached. Thus, there could be positive and/or negative ring back specifications that the ring back must meet. This type of analysis is well within the purview of one skilled in the art.

What has been shown is an automatic driver adjuster and methods using the same that modify off-chip drivers based on load characteristics. Preferred embodiments of the current invention analyze and determine the impedance of a node and adjust a number of output drivers in response to the impedance of the node, or analyze a resultant waveform of the node, caused by an input waveform, and adjust a number of output drivers in response to the resultant waveform of the node.

While the invention has been particularly shown and described with reference to preferred embodiments thereof, it will be understood by those skilled in the art that various changes in form and details may be made therein without departing from the spirit and scope of the invention. Accordingly, unless otherwise specified, any dimensions of the apparatus indicated in the drawings or herein are given as an example of possible dimensions and not as a limitation. Similarly, unless otherwise specified, any sequence of steps of the method indicated in the drawings or herein are given as an example of a possible sequence and not as a limitation.

What is claimed is:

1. An automatic driver adjuster coupled to a node, the automatic driver adjuster comprising a plurality of output drivers, a current source, and a plurality of counter wherein the automatic driver adjuster is configured to determine an impedance of the node, adjust the plurality of output drivers in response to the impedance of the node, enable the current source, and determine a capacitance of the node through measuring a resultant voltage thereon, and wherein each of the plurality of counters is configured to count a time taken for the resultant voltage on the node to reach one of a plurality of predetermined voltages, thereby providing a count proportionate to the capacitance.

2. The automatic driver adjuster of claim 1 wherein the automatic driver adjuster adjusts the plurality of output drivers by enabling more or less output drivers to match the impedance or a fraction of the impedance.

3. The automatic driver adjuster of claim 1 wherein the automatic driver adjuster adjusts the plurality of output drivers by selectively enabling particular drivers to match the impedance or a fraction of the impedance.

4. The automatic driver adjuster of claim 1 further comprising a current source coupled to the node, and wherein the automatic driver adjuster enables the current source and measures the resultant voltage on the node to determine a resistance of the node.

5. The automatic driver adjuster of claim 4 further comprising a plurality of voltage comparators, each voltage comparator having a plurality of inputs and at least one output, one input coupled to one of a plurality of reference voltages and another other input coupled to the node, each voltage comparator comparing one of the plurality of reference voltages with the resultant voltage.

6. The automatic driver adjuster of claim 5 wherein each of the outputs of the plurality of voltage comparators is coupled to one of the plurality of output drivers, and wherein each of the voltage comparators produces an enable signal on its respective output if the resultant voltage is greater than the voltage comparator's respective one of the plurality of reference voltages.

7. The automatic driver adjuster of claim 6 further comprising a register comprising inputs and outputs, wherein each of outputs of the plurality of voltage comparators is coupled to one input of the register, and wherein each of the outputs of the register is coupled to one of the plurality of output drivers, the register storing a configuration of the plurality of enables.

8. The automatic driver adjuster of claim 6 further comprising a combinatorial logic circuit coupled to the plurality of output drivers and to the plurality of outputs from the voltage comparators, the combinatorial logic circuit selectively enabling particular drivers based on the plurality of outputs.

9. The automatic driver adjuster of claim 8 wherein each of the plurality output drivers has a binary-weighted source resistance.

10. The automatic driver adjuster of claim 4 wherein the automatic driver adjuster measures the resultant voltage after a predetermined time has elapsed after enabling the current source.

11. The automatic driver adjuster of claim 1 wherein the current source produces a Direct Current (DC) current and an amplitude of the DC current is chosen to reduce transmission line effects.

12. The automatic driver adjuster of claim 1 further comprising a plurality of voltage comparators, each voltage comparator having two inputs and an output, one of the inputs coupled to one of a plurality of the reference voltages and the other input coupled to the node, each output coupled to an input of one of the plurality of counters, wherein each voltage comparator produces a disable signal when the difference between its respective reference voltage and the resultant voltage reaches a predetermined voltage, and wherein each counter counts until stopped by its associated disable signal.

13. The automatic driver adjuster of claim 1 further comprising a register comprising inputs and outputs, wherein each counter has an output, wherein each of outputs of the plurality of counters is coupled to one input of the register, and wherein each of the outputs of the register is coupled to one of the plurality of output drivers, the register selectively enabling driven through its plurality of outputs.

14. The automatic driver adjuster of claim 1 further comprising a combinatorial logic circuit coupled to the plurality of output drivers and to the plurality of counters, the combinatorial logic circuit selectively enabling particular output drivers based on the plurality of counters.

15. An automatic driver adjuster comprising a plurality of output driver and coupled to a node, the automatic driver adjuster configured to analyze at least one resultant waveform of the node caused by an input waveform injecting a test current onto the node, and adjust the plurality of output drivers in response to the impedance at the node by enabling more or fewer output drivers until the approximate capacitance reaches at least one predetermined voltage specification selected from the group consisting of an undershoot specification, an overshoot specification, and a ring back specification by using estimation of the capacitance.

16. An automatic driver adjuster coupled to a node, the automatic driver adjuster comprising a plurality of positive drivers, wherein the automatic driver adjuster is configured to analyze the impedance at the node caused by an input waveform injecting a test current onto the node, and adjust the plurality of positive drivers in response to the resultant capacitance of the node, wherein the automatic driver adjuster further comprises a voltage comparator that compares a positive peak of the resultant waveform with a predetermined maximum positive voltage level.

17. The automatic driver adjuster of claim 16 wherein the automatic driver adjuster further comprises a plurality of reference positive voltage levels, and wherein one of the plurality of reference positive voltage levels is selected to be the predetermined maximum positive voltage level.

18. The automatic driver adjuster of claim 16 further comprising a register counter, the register counter coupled to an output of the voltage comparator and selectively enabling at least one of the plurality of positive drivers such that the positive peak of the resultant waveform is less than the predetermined maximum positive voltage level.

* * * * *